(12) United States Patent
Gu et al.

(10) Patent No.: US 12,349,459 B1
(45) Date of Patent: Jul. 1, 2025

(54) HIGH-VOLTAGE SEMICONDUCTOR DEVICE STRUCTURES

(71) Applicant: GlobalFoundries U.S. Inc., Malta, NY (US)

(72) Inventors: Man Gu, Malta, NY (US); Haiting Wang, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/907,840

(22) Filed: Oct. 7, 2024

(51) Int. Cl.
*H10D 84/85* (2025.01)
*H10D 64/27* (2025.01)
*H10D 84/01* (2025.01)
*H10D 84/03* (2025.01)

(52) U.S. Cl.
CPC ......... *H10D 84/856* (2025.01); *H10D 64/518* (2025.01); *H10D 84/0179* (2025.01); *H10D 84/0193* (2025.01); *H10D 84/038* (2025.01); *H10D 84/853* (2025.01)

(58) Field of Classification Search
CPC .......... H01L 29/42384; H01L 27/0922; H10D 84/856; H10D 64/518; H10D 84/0179; H10D 84/0193; H10D 84/038; H10D 84/853
See application file for complete search history.

(56) References Cited

U.S. PATENT DOCUMENTS

| | | | |
|---|---|---|---|
| 11,417,739 B2 | 8/2022 | Lin et al. | |
| 2005/0239252 A1 | 10/2005 | Ahn et al. | |
| 2009/0114966 A1 | 5/2009 | Renn | |
| 2023/0141716 A1 | 5/2023 | Yang et al. | |
| 2023/0197710 A1* | 6/2023 | Hsu | H01L 27/0886 257/355 |
| 2024/0061320 A1 | 2/2024 | Huang et al. | |
| 2024/0213247 A1* | 6/2024 | Hsu | H01L 21/823814 |

OTHER PUBLICATIONS

Hu, Zhenyug et al., "High-Voltage Semiconductor Device Structures" filed on Jun. 28, 2024 as a U.S. Appl. No. 18/758,069.

* cited by examiner

*Primary Examiner* — Evan G Clinton
(74) *Attorney, Agent, or Firm* — Thompson Hine LLP; Francois Pagette (57) ABSTRACT

Device structures for a high-voltage semiconductor device and methods of forming such device structures. The structure comprises a semiconductor substrate including a trench, and a field-effect transistor including a first and second source/drain regions in the semiconductor substrate, a gate dielectric inside the trench, and a gate on the gate dielectric. The gate and the gate dielectric are disposed laterally between the first and second source/drain regions.

16 Claims, 10 Drawing Sheets

HIGH-VOLTAGE SEMICONDUCTOR DEVICE STRUCTURES

BACKGROUND

The disclosure relates to semiconductor device fabrication and integrated circuits and, more specifically, to device structures for a high-voltage semiconductor device and methods of forming such device structures.

Complementary-metal-oxide-semiconductor processes may be used to build a combination of p-type and n-type field-effect transistors that are used to construct, for example, logic cells. Field-effect transistors generally include a channel region in a substrate, a source, a drain, and a gate structure over the channel region. When a control voltage exceeding a characteristic threshold voltage is applied to a gate electrode of the gate structure, carrier flow occurs in the channel region between the source and the drain to produce a device output current.

A fin-type field-effect transistor is a non-planar device structure that may be more densely packed in an integrated circuit than a planar field-effect transistor. A fin-type field-effect transistor may include a fin, gate structures that overlap with different portions of the fin, and source/drain regions arranged between the gate structures. The source/drain regions may be epitaxially grown inside cavities that are etched in the fin.

Planar field-effect transistors may be configured to operate at a voltage, such as a voltage of 20 volts to 25 volts, that is significantly greater than the operational voltage for a fin-type field-effect transistor. High-voltage planar field-effect transistors cannot be integrated into a process flow forming fin-type field-effect transistors without significantly impacting the formation of the fin-type field-effect transistors.

Improved device structures for a high-voltage semiconductor device and methods of forming such device structures are needed.

SUMMARY

In an embodiment of the invention, a structure comprises a semiconductor substrate including a trench, and a field-effect transistor including a first source/drain region in the semiconductor substrate, a second source/drain region in the semiconductor substrate, a gate dielectric inside the trench, and a gate on the gate dielectric. The gate and the gate dielectric are laterally positioned between the first source/drain region and the second source/drain region.

In an embodiment of the invention, a method comprises forming a trench in a semiconductor substrate and forming a field-effect transistor including first and second source/drain regions in the semiconductor substrate, a gate dielectric inside the trench, and a gate on the gate dielectric. The gate and the gate dielectric are laterally positioned between the first source/drain region and the second source/drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
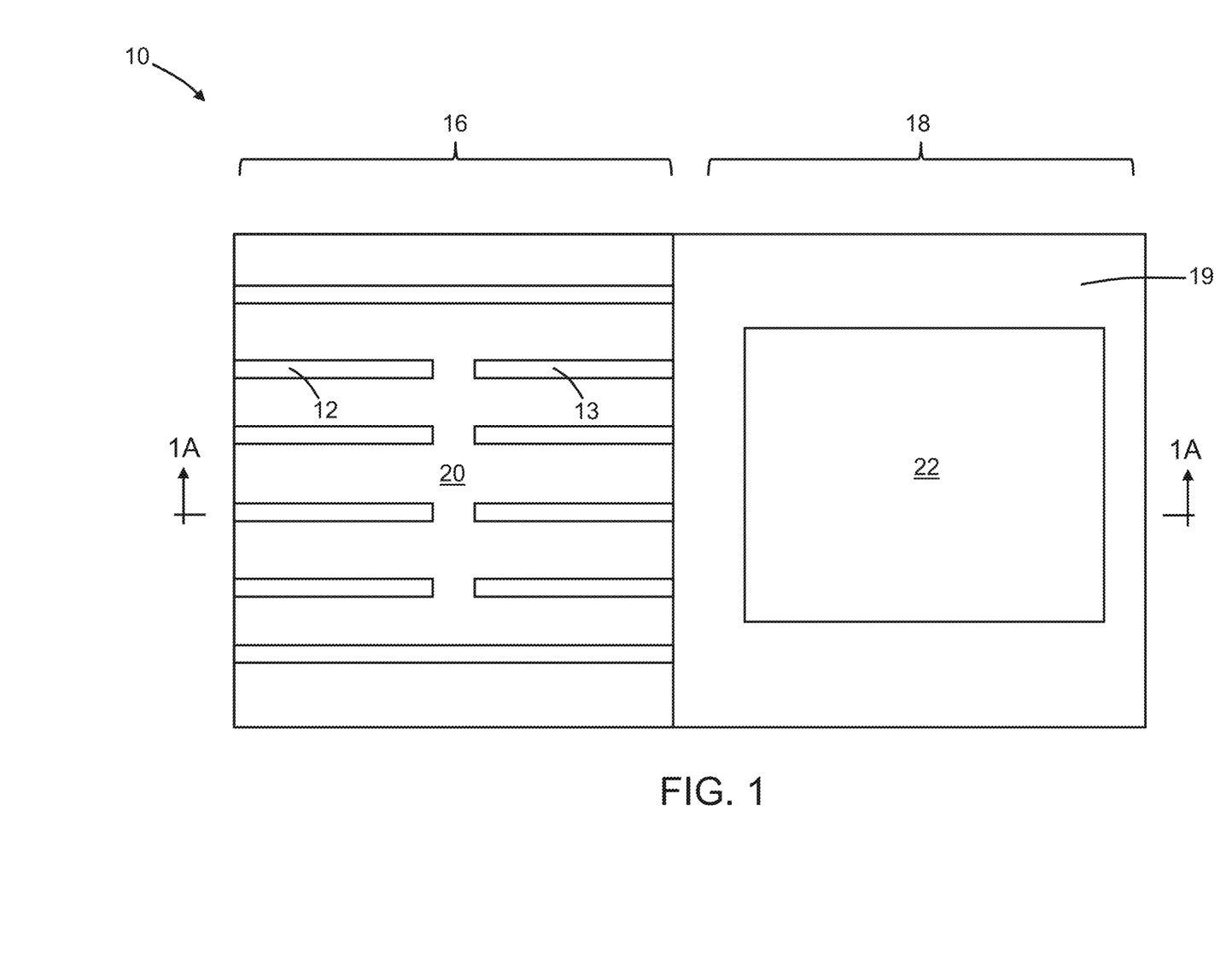
FIG. 1 is a top view of a structure at an initial fabrication stage of a processing method in accordance with embodiments of the invention.
Figure 1A:
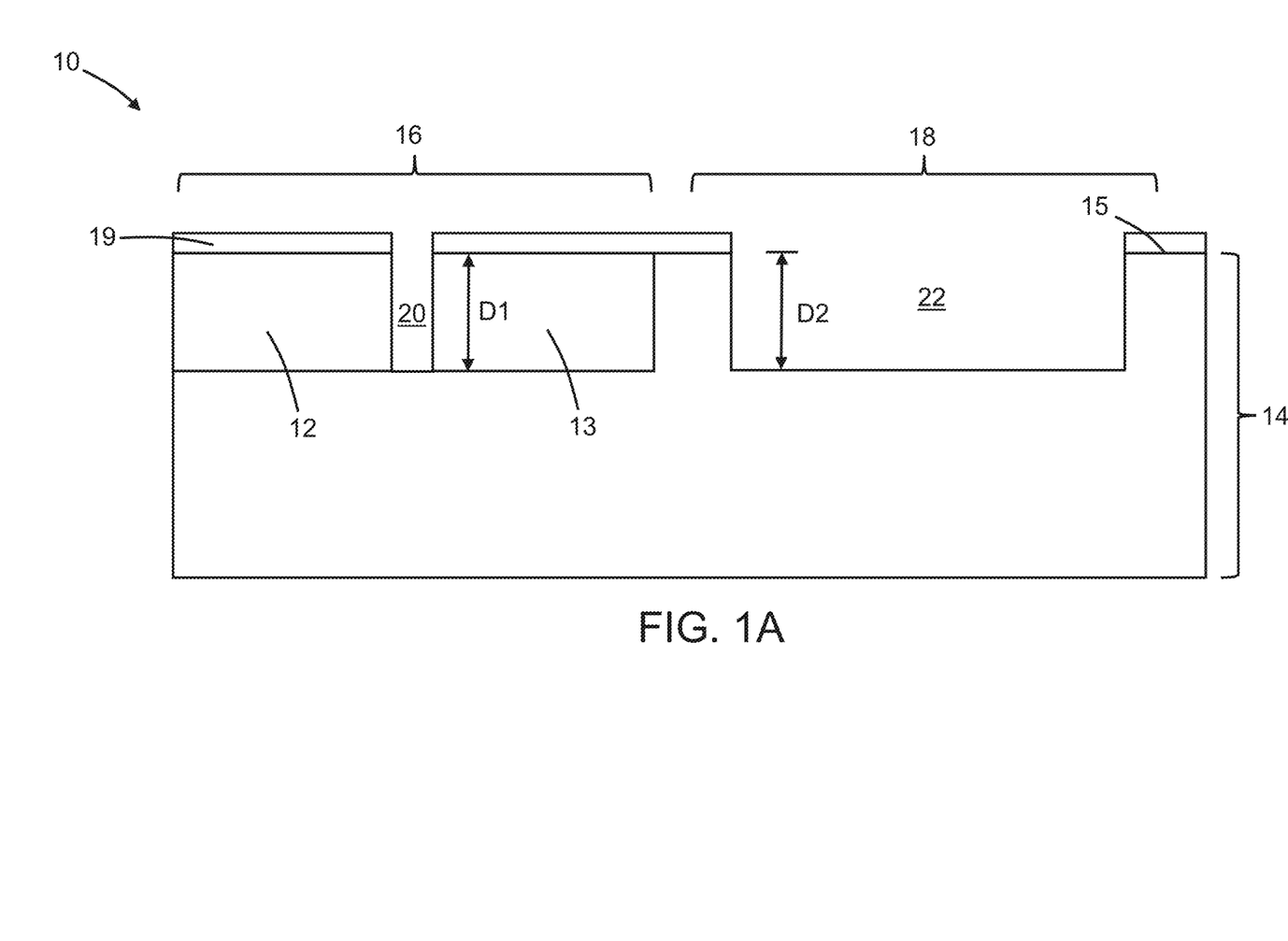
FIG. 1A is a cross-sectional view taken generally along line 1A-1A in FIG. 1.

With reference to FIGS. 1, 1A and in accordance with embodiments of the invention, a structure 10 includes fins 12, fins 13, and a semiconductor substrate 14. The fins 12, the fins 13, and the semiconductor substrate 14 may be comprised of a single-crystal semiconductor material, such as single-crystal silicon. The semiconductor material of the semiconductor substrate 14 may be lightly doped with a concentration of a p-type dopant (e.g., boron). The fins 12 and the fins 13 may be patterned from the semiconductor material of the semiconductor substrate 14 using lithography and etching processes. The fins 12 may be arranged in a column of an array, the fins 13 may be arranged in a column of the array, and pairs of the fins 12, 13 may be arranged in rows of the array.

The semiconductor substrate 14 includes a device region 16 and a planar device region 18. The planar device region 18 may be disposed adjacent to the device region 16. The planar device region 18 is reserved and protected during the patterning of the fins 12, 13 in the device region 16.

A trench 20 may be patterned in the device region 16 using lithography and etching processes. The trench 20 may surround the fins 12 and the fins 13 in the device region 16. A trench 22 may be patterned in the planar device region 18 using lithography and etching processes. The trenches 20, 22 may be formed by applying a hardmask 19 that is patterned to define openings over the intended locations for the trenches 20, 22 and then forming the trenches 20, 22 with an etching process. In an embodiment, the trench 20 may have a maximum depth D1 relative top surface 15 of the semiconductor substrate 14, the trench 22 may have a maximum depth D2 relative top surface 15 of the semiconductor substrate 14, and the depth D2 of the trench 22 may be equal to the maximum depth D1 of the trench 20.

Figure 2:
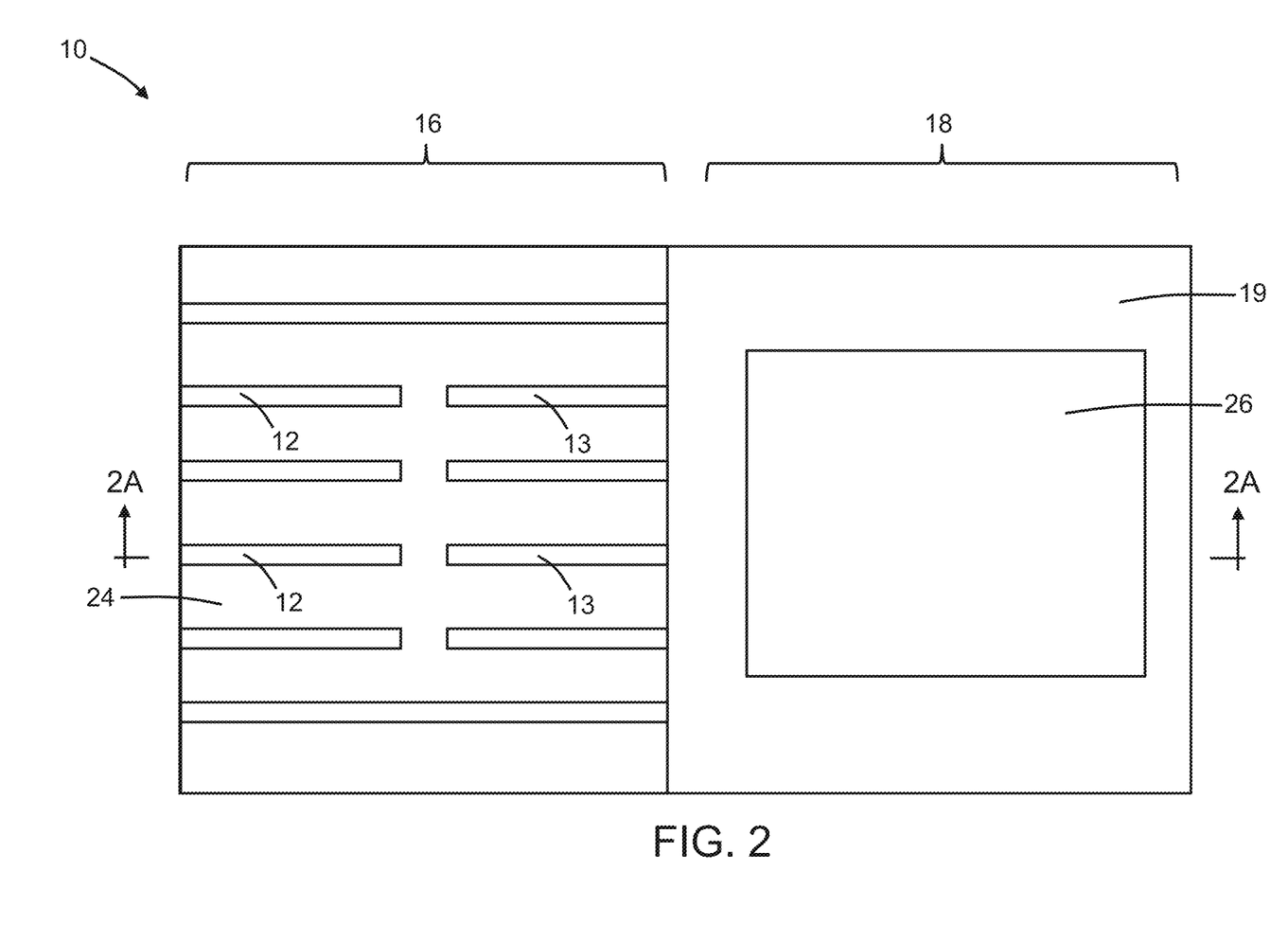
FIG. 2 is a top view of the structure at a fabrication stage of the processing method subsequent to FIGS. 1, 1A.
Figure 2A:
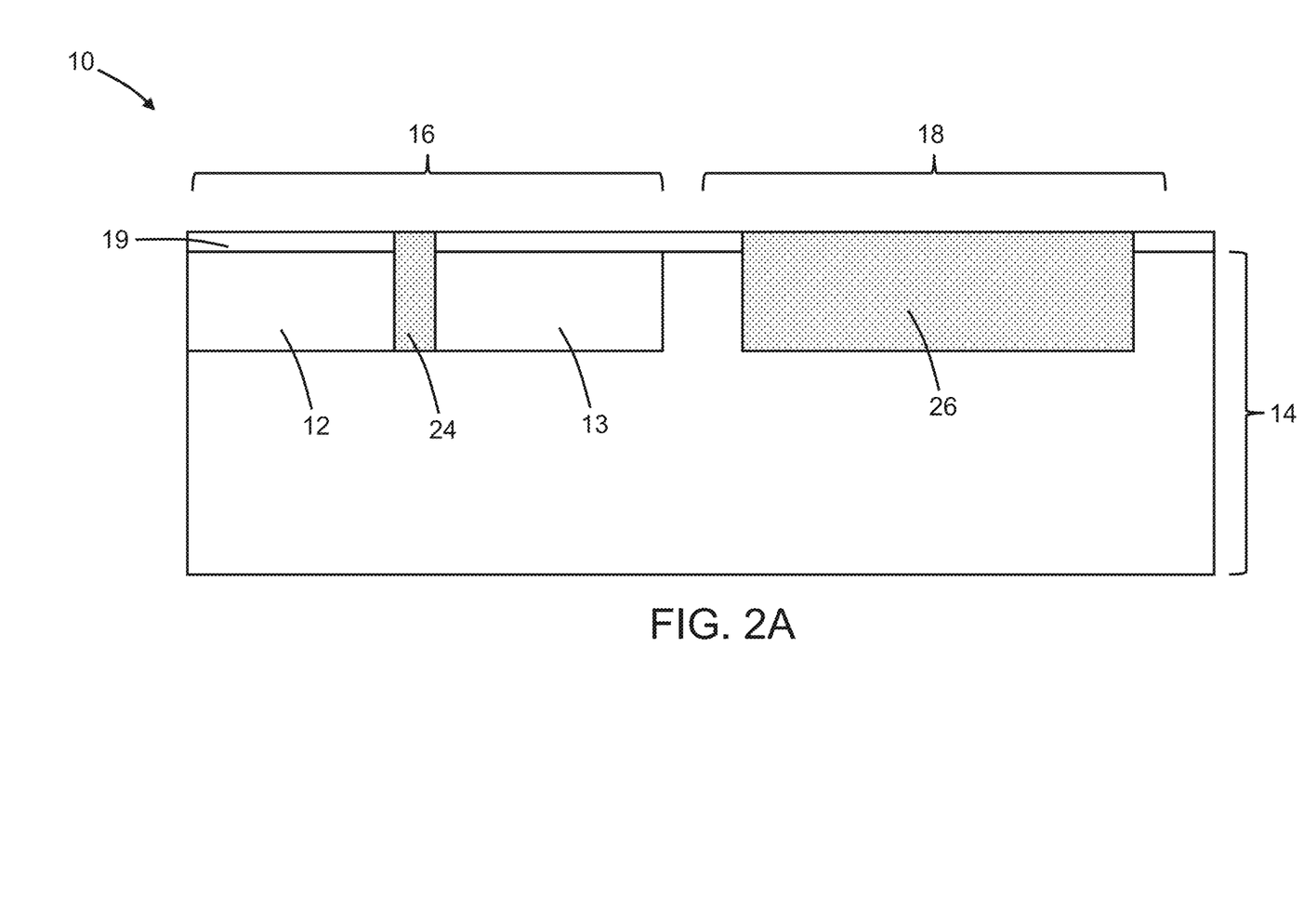
FIG. 2A is a cross-sectional view taken generally along line 2A-2A in FIG. 2.

With reference to FIGS. 2, 2A and at a fabrication stage subsequent to FIGS. 1, 1A, a dielectric layer 24 is formed in the trench 20, and a dielectric layer 26 is formed in the trench 22. The dielectric layers 24, 26 may be comprised of a dielectric material that is an electrical insulator. In an embodiment, the dielectric layers 24, 26 may be comprised of silicon dioxide. In an embodiment, a liner comprised of a thin layer of silicon dioxide and a thin layer of polysilicon may be formed inside the trenches 20, 22 before forming the dielectric layers 24, 26. The dielectric layers 24, 26 may be formed by depositing their constituent dielectric material and then polishing the deposited dielectric material with chemical-mechanical polishing. The dielectric layer 24 may acquire the shape of the trench 20 and may also extend to the maximum depth D1 of the trench 20. The dielectric layer 24 may project above the uppermost surfaces of the fins 12, 13. The dielectric layer 26 may acquire the shape of the trench 22 and may also extend to the maximum depth D2 of the trench 22. The dielectric layer 26 may be coplanar with the uppermost surface of the semiconductor substrate 14 in the planar device region 18.

Figure 3:
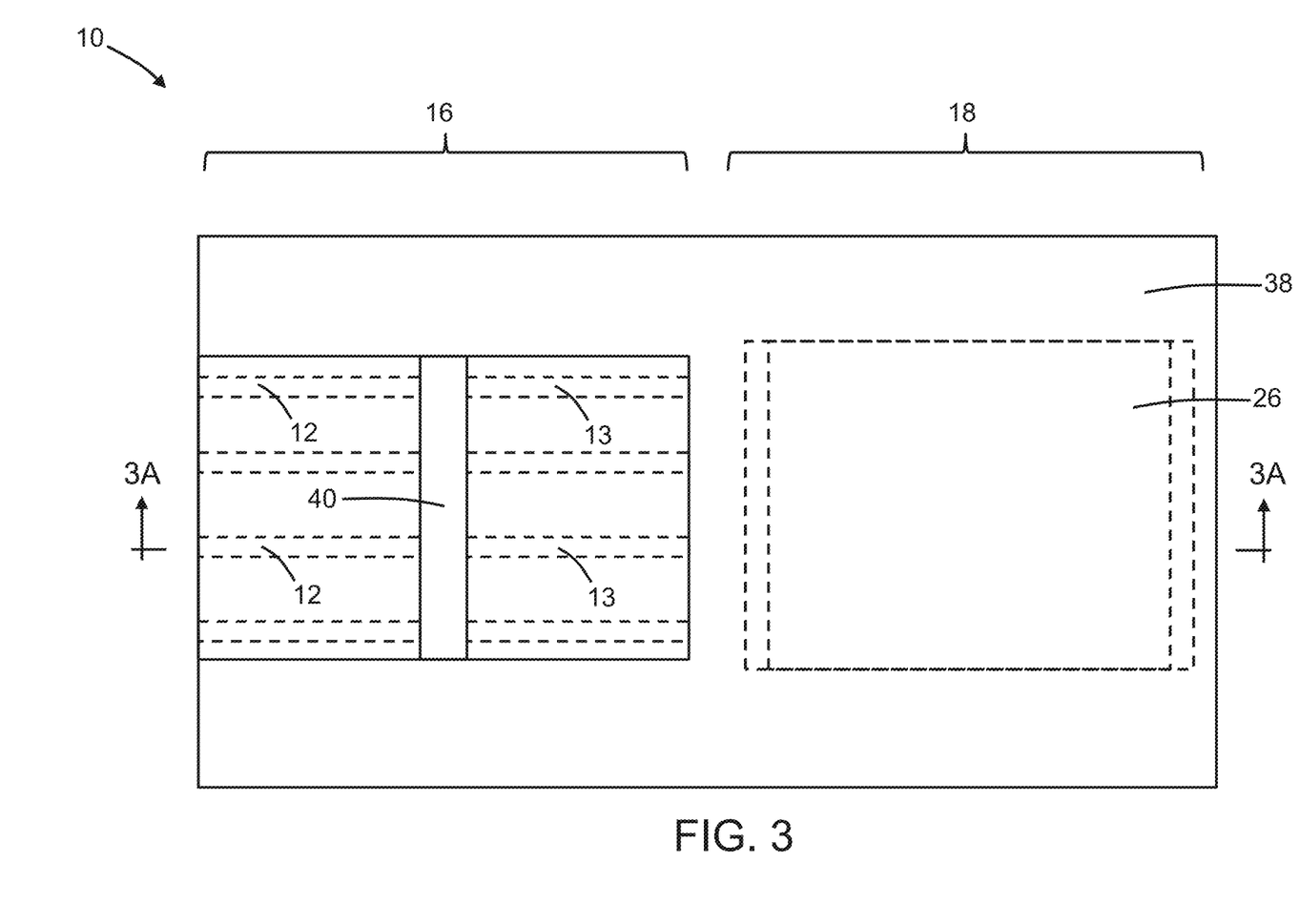
FIG. 3 is a top view of the structure at a fabrication stage of the processing method subsequent to FIGS. 2, 2A.
Figure 3A:
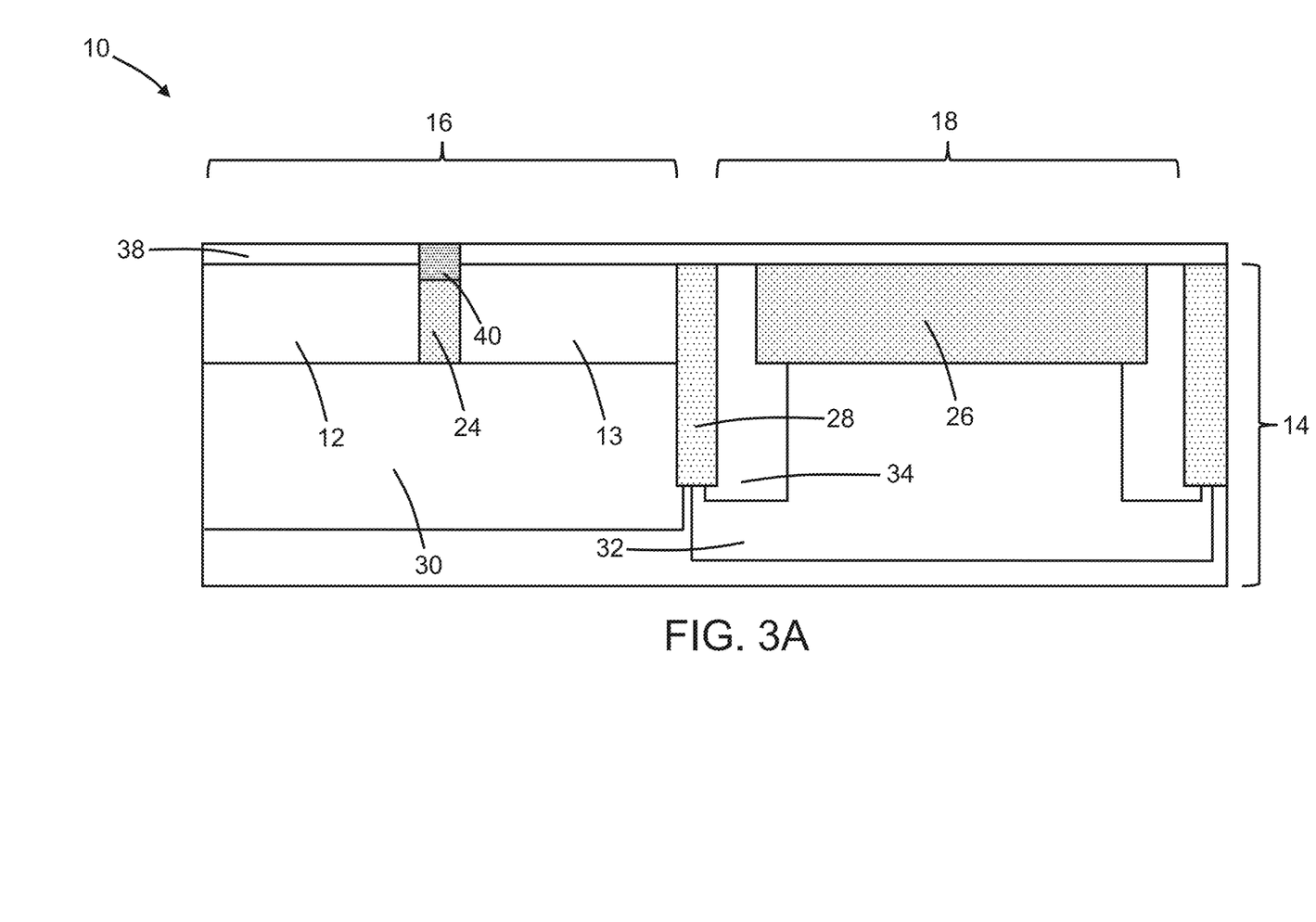
FIG. 3A is a cross-sectional view taken generally along line 3A-3A in FIG. 3.

With reference to FIGS. 3, 3A and at a fabrication stage subsequent to FIGS. 2, 2A, trench isolation regions 28 may be formed by patterning shallow trenches with lithography and etching processes, depositing a dielectric material, such as silicon dioxide, in the shallow trenches, and planarizing and/or recessing the deposited dielectric material. The trench isolation regions 28 extend to a greater maximum depth than either the maximum depth D1 of the dielectric layer 24 or the maximum depth D2 of the dielectric layer 26. One of the trench isolation regions 28 may separate the device region 16 from the planar device region 18.

The fins 12, 13 in the device region 16 may be used to form one or more fin-type field-effect transistors. The planar device region 18 may be used to form a high-voltage semiconductor device structure in the representative form of a field-effect transistor. The field-effect transistor formed in the planar device region 18 that does not integrate a fin similar to the fins 12, 13 but is instead a planar device.

A well 30 may be formed in a portion of the device region 16 of the semiconductor substrate 14. In an embodiment, the well 30 may contain a concentration of an n-type dopant, such as phosphorus, to provide n-type conductivity. In an alternative embodiment, the well 30 may contain a concentration of a p-type dopant, such as boron, to provide p-type conductivity. The well 30 may be formed by implanting ions, such as ions including the n-type dopant, with an implantation mask having an opening defining the intended location for the well 30 in the semiconductor substrate 14. The implantation conditions, such as ion species, dose, and kinetic energy, may be selected to tune the electrical and physical characteristics of the well 30. The well 30 may extend to a greater depth in the semiconductor substrate 14 than the trench isolation regions 28.

A well 32 may be formed in a portion of the planar device region 18 of the semiconductor substrate 14. In an embodiment, the well 32 may contain a concentration of a p-type dopant, such as boron, to provide p-type conductivity. In an alternative embodiment, the well 32 may contain a concentration of an n-type dopant, such as phosphorus, to provide n-type conductivity. The well 32 may be formed by implanting ions, such as ions including the p-type dopant, with an implantation mask having an opening defining the intended location for the well 32 in the semiconductor substrate 14. The implantation conditions, such as ion species, dose, and kinetic energy, may be selected to tune the electrical and physical characteristics of the well 32. The well 32 may provide a drain extension of the field-effect transistor that is formed in the planar device region 18. In an embodiment, the well 32 may extend to a greater depth in the semiconductor substrate 14 than the well 30 and the trench isolation regions 28.

Doped regions 34 are formed in respective portions of the well 32 in the planar device region 18 of the semiconductor substrate 14. The doped regions 34 may have an opposite conductivity type from the well 32. In an embodiment, the doped regions 34 may contain a concentration of an n-type dopant, such as phosphorus, to provide n-type conductivity. The doped regions 34 may be formed by implanting ions, such as ions including the n-type dopant, with an implantation mask having openings defining the intended locations for the doped regions 34 in the semiconductor substrate 14. The implantation conditions, such as ion species, dose, and kinetic energy, may be selected to tune the electrical and physical characteristics of the doped regions 34. The doped regions 34 may extend to a shallower depth in the semiconductor substrate 14 than the well 32, and the doped regions 34 may extend to a greater depth in the semiconductor substrate 14 than the trench isolation regions 28.

A hardmask 38 may be applied over the device region 16 and the planar device region 18. An opening may be patterned in the hardmask 38 that is aligned with the dielectric layer 24 in the device region 16.

A dielectric layer 40 may be formed inside the opening in the hardmask 38 on the dielectric layer 24. The dielectric layer 40 may overlap with the dielectric layer 24, and the dielectric layer 40 may be coplanar with the top surface of the hardmask 38. In an embodiment, the dielectric layer 40 may directly contact the overlapped dielectric layer 24. The dielectric layer 40 may be comprised of a dielectric material that is an electrical insulator. In an embodiment, the dielectric layer 40 may be comprised of silicon dioxide. In an embodiment, the dielectric layer 40 may have a thickness in a range of about 50 nanometers to about 80 nanometers.

Figure 4:
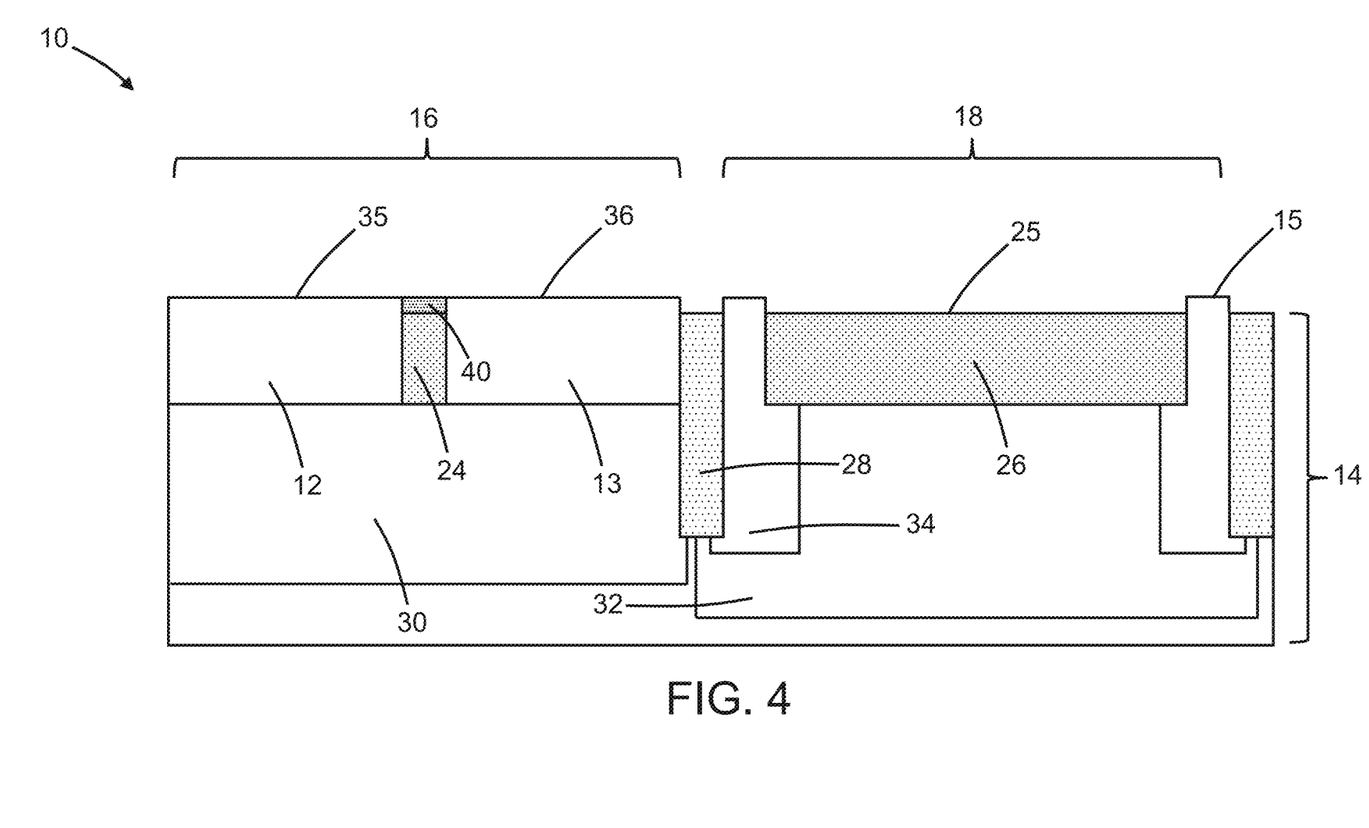
FIG. 4 is a cross-sectional view of the structure at a fabrication stage of the processing method subsequent to FIGS. 3, 3A.

With reference to FIG. 4 and at a fabrication stage subsequent to FIGS. 3, 3A, the hardmask 38 may be removed and, although not shown, the dielectric material of the dielectric layers 24, 40, the dielectric material of the trench isolation regions 28, and the dielectric material of the dielectric layers 24, 40 between the fins 13 may be recessed by an etching process to reveal the fins 12, 13. The recessed uppermost surface of the dielectric layer 40 may be coplanar with the top surfaces of the fins 12, 13.

The dielectric material of the dielectric layer 26 may also be recessed by the etching process. In that regard, the recessed dielectric layer 26 may have a top surface 25 that is positioned below the top surface 15 of the semiconductor substrate 14 such that the top surface 15 and the top surface 25 are not coplanar. In an embodiment, the recessed dielectric layer 26 may have a thickness in a range of about 60 nanometers to about 100 nanometers. The fins 12 may have respective top surfaces 35 that may be coplanar with the top surface 15, and the fins 13 may have respective top surfaces 36 that also may be coplanar with the top surface 15.

Figure 5:
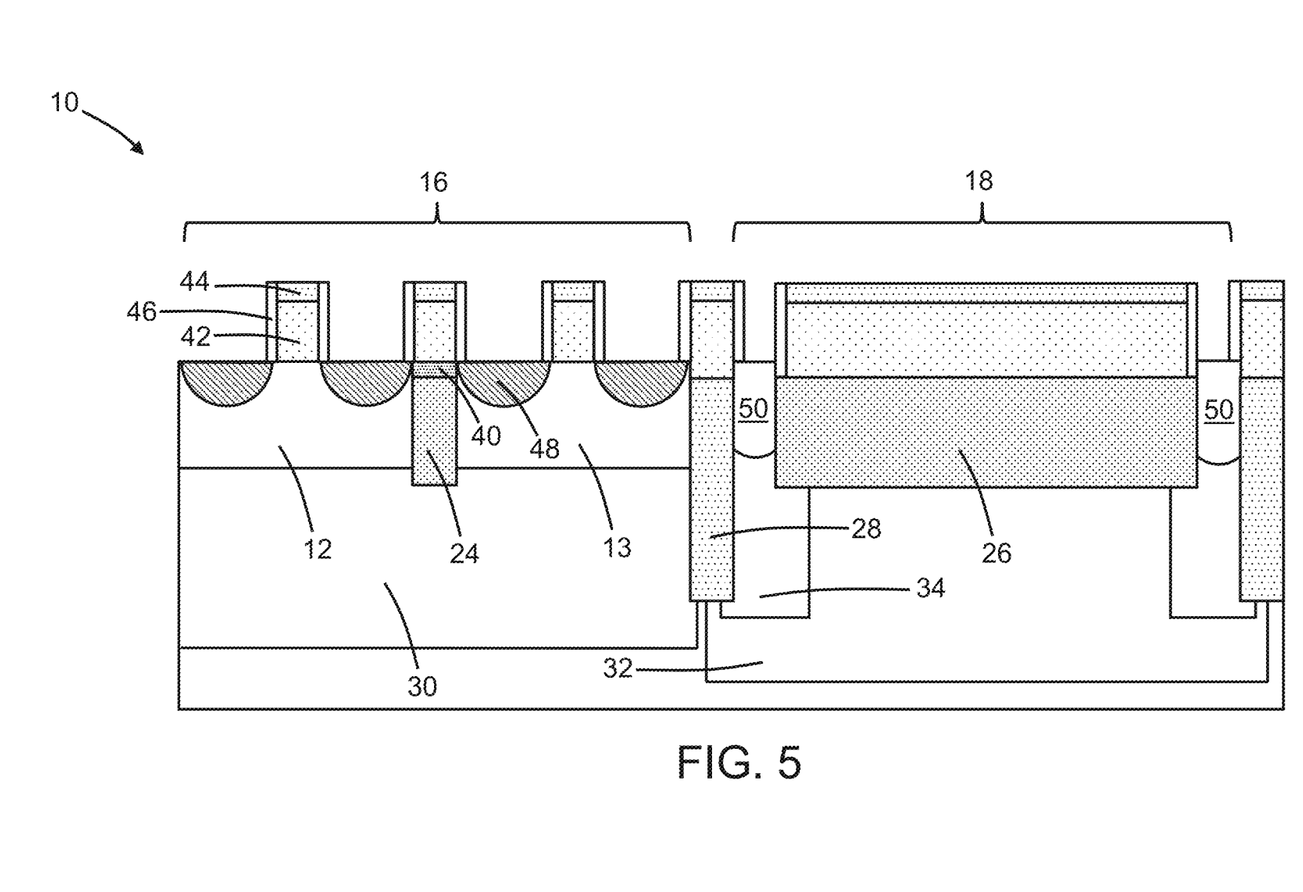
FIG. 5 is a cross-sectional view of the structure at a fabrication stage of the processing method subsequent to FIG. 4.

With reference to FIG. 5 and at a fabrication stage subsequent to FIG. 4, a layer 42 and a layer 44 may be sequentially deposited and patterned by lithography and etching processes. The layer 42 may be comprised of, for example, polysilicon, and the layer 44 may be comprised of, for example, silicon nitride that operates as a hardmask when the layer 42 is patterned. The patterned layers 42, 44 may include a portion positioned on the dielectric layer 26, as well as portions that extend transversely across the fins 12, 13. In an embodiment, the patterned layers 42, 44 may represent a sacrificial layer stack that is removed and replaced later in the process flow. Spacers 46 may be formed adjacent to the sidewalls of the patterned layers 42, 44. The spacers 46 may be comprised of one or more dielectric material that are electrical insulators.

Source/drain regions 48 may be formed inside cavities that are patterned in the fins 12, 13 by lithography and etching processes. As used herein, the term "source/drain region" means a region of semiconductor material that can function as either a source or a drain of a field-effect transistor. The source/drain regions 48 may be coextensive with the top surfaces 35, 36 of the fins 12, 13. The source/drain regions 48, which are laterally positioned between the layer stacks including the patterned layers 42, 44, may be comprised of a semiconductor material, such as silicon or silicon-germanium. The semiconductor material of the source/drain regions 48 may be grown by an epitaxial growth process from the surfaces of the fins 12, 13 bordering the cavities and may be in situ doped during epitaxial growth with a concentration of a dopant. The semiconductor material of the source/drain regions 48 may be doped with an n-type dopant, such as phosphorus, that provides n-type conductivity. Alternatively, the semiconductor material of the source/drain regions 48 may be doped with a p-type dopant, such as boron, that provides p-type conductivity.

Source/drain regions 50 are formed in respective portions of the planar device region 18 of the semiconductor substrate 14. The source/drain regions 50 are arranged inside the doped regions 34 adjacent to the portion of the patterned layers 42, 44 in the planar device region 18. The source/drain regions 50 extend to a shallower depth than the doped regions 34. A lower portion of each source/drain region 50 may be laterally positioned between the dielectric layer 26 and the adjacent trench isolation region 28.

In an embodiment, the source/drain regions 50 may contain a concentration of an n-type dopant, such as phosphorus, to provide n-type conductivity. In an alternative embodiment, the source/drain regions 50 may contain a concentration of a p-type dopant, such as boron, to provide p-type conductivity. In an embodiment, the doped regions 34 and the source/drain regions 50 may contain the same type of dopant. The source/drain regions 50 may be formed by implanting ions, such as ions including the n-type dopant, with an implantation mask having openings defining the intended locations for the source/drain regions 50 in the semiconductor substrate 14. The implantation conditions, such as ion species, dose, and kinetic energy, may be selected to tune the electrical and physical characteristics of the source/drain regions 50, which may be more heavily doped than the doped regions 34.

The source/drain regions 50 may be coextensive with the top surface 15 of the semiconductor substrate 14 that is coplanar with the top surfaces 35, 36. The source/drain regions 50 extend to a maximum depth relative to the top surface 15 of the semiconductor substrate 14 that is less than the maximum depth D2 of the dielectric layer 26. The channel of the field-effect transistor formed in the planar device region 18 is located in a portion of the well 32 beneath the dielectric layer 26 and laterally between the doped regions 34.

Figure 6:
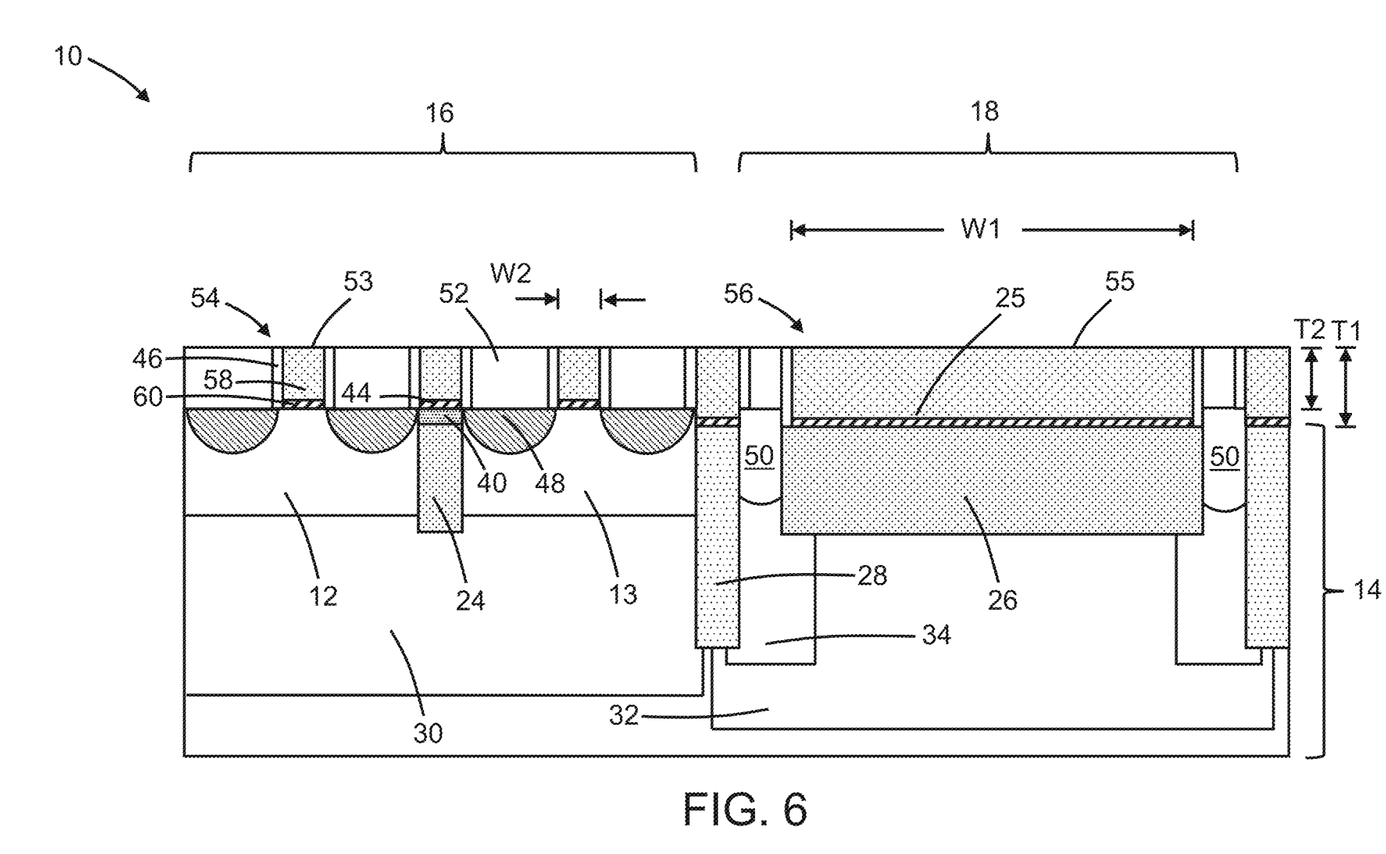
FIG. 6 is a cross-sectional view of the structure at a fabrication stage of the processing method subsequent to FIG. 5.

With reference to FIG. 6 and at a fabrication stage subsequent to FIG. 5, a dielectric layer 52 may be deposited and planarized, the layers 42, 44 may be removed by an etching process, gate structures 54 may be formed in the device region 16, and a gate structure 56 may be formed in the planar device region 18. Each of that gate structures 54, 56 may include an upper layer 58 comprised of one or more metals, such as a work function metal and tungsten, and a lower layer 60 comprised of an electrical insulator, such as a high-k dielectric material like hafnium dioxide. Trench silicide contacts (not shown) may be formed that physically and electrically contact the source/drain regions 48 of the fin-type field-effect transistor in the device region 16 and the source/drain regions 50 of the field-effect transistor formed in the planar device region 18.

Each of the gate structures 54 has a top surface 53, and the gate structure 56 has a top surface 55 that may be substantially coplanar, or coplanar, with the top surfaces 53 of the gate structures 54. The width W1 of the top surface 55 of the gate structure 56 may be greater than the width W2 of the top surface 53 of each gate structure 54. The coplanarity may result from the replacement metal gate process used to form the gate structures 54, 56. In that regard, the gate structure 56 is formed in the planar device region 18 as part of a shared process flow that also forms the gate structures 54 of the fin-type field-effect transistor in the device region 16. The gate structure 56 has a thickness T1, each of the gate structures 54 has a thickness T2, and the thickness T1 may be greater than the thickness T2 because of the prior recessing of the dielectric layer 26. The field-effect transistor may be formed in the planar device region 18 by the integrated process flow without interruption to the formation of the fin-type field effect transistor in the device region 16.

The dielectric layer 26 provides a portion of a gate dielectric for the field-effect transistor that is formed in the planar device region 18. The gate dielectric for the field-effect transistor that is formed in the planar device region 18 also includes a contribution from the lower layer 60 of the gate structure 56.

Figure 7:
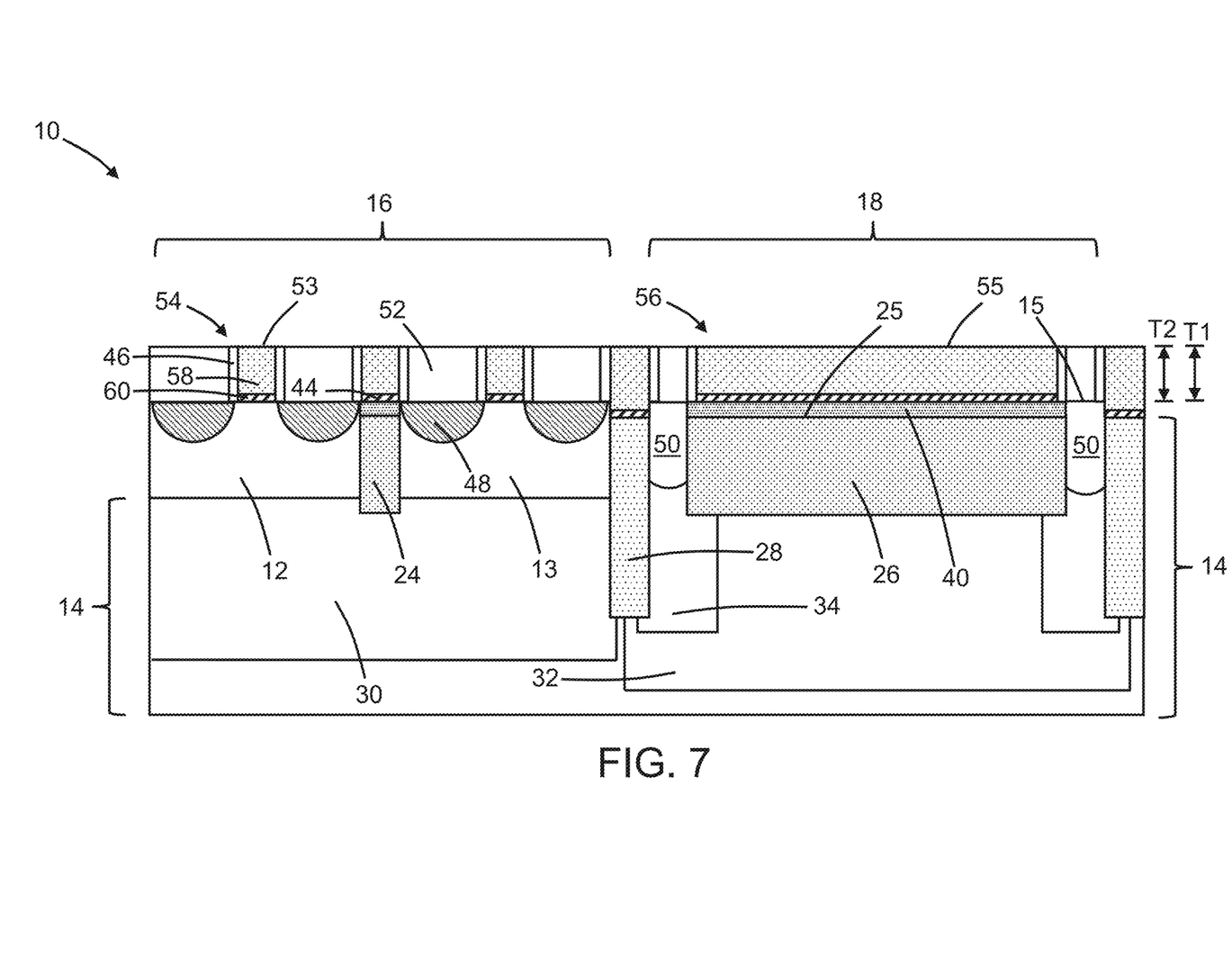
FIG. 7 is a cross-sectional view of a structure in accordance with alternative embodiments of the invention.

With reference to FIG. 7 and in accordance with alternative embodiments, a portion of the dielectric layer 40 may also be formed on the top surface 25 of the dielectric layer 26 concurrently with the formation of the portion of the dielectric layer 40 on the dielectric layer 24. In that regard, the dielectric layer 26 may be recessed when the dielectric layer 24 is recessed, and an additional opening may be formed in the hardmask 38 (FIG. 3A) that is aligned with the dielectric layer 26 before forming the dielectric layer 40. The portion of the dielectric layer 40 on the top surface 25 of the dielectric layer 26 may have a top surface that is coplanar or substantially coplanar with the top surface 15 of the semiconductor substrate 14 and that is coplanar or substantially coplanar with the top surface of the portion of the dielectric layer 40 on the dielectric layer 24. Due to the coplanarity, the thickness T1 of the gate structure 56 and the thickness T2 of the gate structures 54 may be equal.

The dielectric layer 40 provides a portion of a gate dielectric for the field-effect transistor that is formed in the planar device region 18. The gate dielectric for the field-effect transistor that is formed in the planar device region 18 also includes a contribution from the dielectric layer 26 and a contribution from the lower layer 60 of the gate structure 56. The addition of the dielectric layer 40 may thicken the gate dielectric and increase the voltage handling capability of the field-effect transistor that is formed in the planar device region 18.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor substrate including a trench and a top surface; and
a first field-effect transistor including a first source/drain region in the semiconductor substrate, a second source/drain region in the semiconductor substrate, a gate dielectric inside the trench, and a first gate on the gate dielectric, the first gate and the gate dielectric laterally positioned between the first source/drain region and the second source/drain region, the first source/drain region and the second source/drain region coextensive with the top surface of the semiconductor substrate, the gate dielectric including a first dielectric layer, a second dielectric layer on the first dielectric layer, and a third dielectric layer on the second dielectric layer, the first dielectric layer and the second dielectric layer comprising silicon dioxide, the third dielectric layer comprising a high-k dielectric material, and the second dielectric layer coplanar with the top surface of the semiconductor substrate.

2. The structure of claim 1 wherein the first dielectric layer has a first thickness, and the second dielectric layer has a second thickness that is less than the first thickness.

3. The structure of claim 1 wherein the first dielectric layer of the gate dielectric extends to a first maximum depth relative to the top surface of the semiconductor substrate, the first source/drain region and the second source/drain region extend to a second maximum depth relative to the top surface of the semiconductor substrate, and the first maximum depth is greater than the second maximum depth.

4. The structure of claim 1 wherein the trench extends from the top surface of the semiconductor substrate into the semiconductor substrate, and the first dielectric layer has a top surface that is recessed below the top surface of the semiconductor substrate.

5. The structure of claim 4 wherein the first dielectric layer extends to a first maximum depth relative to the top surface of the semiconductor substrate, the first source/drain region and the second source/drain region extend to a second maximum depth relative to the top surface of the semiconductor substrate, and the first maximum depth is greater than the second maximum depth.

6. The structure of claim 1 wherein the first field-effect transistor is positioned in a first device region of the semiconductor substrate, and further comprising:
a second field-effect transistor in a second device region of the semiconductor substrate, the second field-effect transistor different from the first field-effect transistor.

7. The structure of claim 6 wherein the second field-effect transistor includes a semiconductor fin on the semiconductor substrate and a second gate extending transversely over the semiconductor fin.

8. The structure of claim 7 wherein the first gate has a first top surface, and the second gate has a second top surface that is substantially coplanar with the first top surface.

9. The structure of claim 7 the first gate has a first width, the second gate has a second width, and the first width is greater than the second width.

10. The structure of claim 7 wherein the first gate has a first thickness, the second gate has a second thickness, and the first thickness is equal to the second thickness.

11. The structure of claim 7 wherein the first gate and the second gate comprise a work function metal.

12. The structure of claim 1 further comprising:
a well in the semiconductor substrate;
a first doped region in a first portion of the well; and
a second doped region in a second portion of the well, wherein the first doped region and the second doped region have an opposite conductivity type from the well, and the first source/drain region and the second source/drain region extend to a shallower depth in the semiconductor substrate than the first doped region and the second doped region.

13. The structure of claim 12 wherein the first doped region and the second doped region extend to a shallower depth in the semiconductor substrate than the well.

14. The structure of claim 13 wherein the first dielectric layer extends to a first maximum depth in the semiconductor substrate, and further comprising:
a trench isolation region that extends to a second maximum depth that is greater than the first maximum depth of the first dielectric layer.

15. The structure of claim 14 wherein the first source/drain region and the second source/drain region extend to a shallower depth in the semiconductor substrate than the first doped region and the second doped region.

16. A method comprising:
   forming a trench in a semiconductor substrate; and
   forming a field-effect transistor including a first source/drain region in the semiconductor substrate, a second source/drain region in the semiconductor substrate, a gate dielectric inside the trench, and a gate on the gate dielectric,
   wherein the gate and the gate dielectric are laterally positioned between the first source/drain region and the second source/drain region, the semiconductor substrate has a top surface, the first source/drain region and the second source/drain region are coextensive with the top surface of the semiconductor substrate, the gate dielectric includes a first dielectric layer, a second dielectric layer on the first dielectric layer, and a third dielectric layer on the second dielectric layer, the first dielectric layer and the second dielectric layer comprise silicon dioxide, the third dielectric layer comprises a high-k dielectric material, and the second dielectric layer is coplanar with the top surface of the semiconductor substrate.

* * * * *